US010228425B2

(12) United States Patent
Park et al.

(10) Patent No.: US 10,228,425 B2
(45) Date of Patent: Mar. 12, 2019

(54) METHOD AND APPARATUS FOR LEARNING AND ESTIMATING BATTERY STATE INFORMATION

(71) Applicant: Samsung Electronics Co., Ltd., Suwon-si (KR)

(72) Inventors: SangDo Park, Seoul (KR); Kaeweon You, Seoul (KR); Sun-Jae Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 373 days.

(21) Appl. No.: 14/732,098

(22) Filed: Jun. 5, 2015

(65) Prior Publication Data

US 2015/0369874 A1    Dec. 24, 2015

(30) Foreign Application Priority Data

Jun. 24, 2014    (KR) .................. 10-2014-0077543

(51) Int. Cl.
*G01R 31/36* (2006.01)
*B60L 3/12* (2006.01)
(Continued)

(52) U.S. Cl.
CPC ........... *G01R 31/3651* (2013.01); *B60L 3/12* (2013.01); *B60L 11/1861* (2013.01); *H02J 7/0047* (2013.01); *B60L 2240/545* (2013.01); *B60L 2240/547* (2013.01); *B60L 2240/549* (2013.01); *B60L 2260/44* (2013.01); *B60W 2710/244* (2013.01); *G01R 31/3679* (2013.01);
(Continued)

(58) Field of Classification Search
CPC ........... G01R 31/3651; G01R 31/3679; B60L 11/1851
See application file for complete search history.

(56) References Cited

U.S. PATENT DOCUMENTS 7,684,942 B2    3/2010 Yun et al.
2010/0283471 A1*  11/2010 Lim .................. B60L 3/0046
                                             324/427
(Continued)

FOREIGN PATENT DOCUMENTS

JP    2003-297435 A    10/2003
JP    2006-312528 A    11/2006
(Continued)

*Primary Examiner* — Khamdan N. Alrobaie
(74) *Attorney, Agent, or Firm* — NSIP Law

(57) ABSTRACT

A method of estimating battery state information includes collecting battery information; partitioning the collected battery information into interval information in a predetermined range; accumulating the interval information; and estimating the battery state information based on the accumulated interval information and learning information determined in advance. A method of learning battery state information includes collecting battery information; partitioning the collected battery information into interval information in a predetermined range; accumulating the interval information; and determining learning information based on the accumulated interval information and reference information of a battery, the learning information being used to estimate the battery state information.

19 Claims, 26 Drawing Sheets

(51) Int. Cl.
*B60L 11/18* (2006.01)
*H02J 7/00* (2006.01)

(52) U.S. Cl.
CPC . *H02J 2007/005* (2013.01); *H02J 2007/0098* (2013.01); *Y02T 10/705* (2013.01); *Y02T 10/7005* (2013.01); *Y02T 10/7044* (2013.01)

(56) References Cited

U.S. PATENT DOCUMENTS

| | | | | |
|---|---|---|---|---|
| 2010/0312744 | A1* | 12/2010 | Prokhorov | G01R 31/3679 706/52 |
| 2011/0260692 | A1* | 10/2011 | Chou | G01R 31/3613 320/136 |
| 2013/0091083 | A1* | 4/2013 | Frisch | G06N 99/005 706/14 |
| 2014/0139189 | A1* | 5/2014 | Izumi | B60L 11/1861 320/134 |
| 2015/0301122 | A1* | 10/2015 | Lee | G01R 31/3679 702/63 |
| 2016/0041231 | A1* | 2/2016 | Lee | G01R 31/3679 702/63 |

FOREIGN PATENT DOCUMENTS

| | | |
|---|---|---|
| KR | 10-0911317 B1 | 8/2009 |
| KR | 10-2010-0063343 A | 6/2010 |
| KR | 10-2011-0084633 A | 7/2011 |
| KR | 10-2012-0120889 A | 11/2012 |
| KR | 10-2013-0091475 A | 8/2013 |

\* cited by examiner

METHOD AND APPARATUS FOR LEARNING AND ESTIMATING BATTERY STATE INFORMATION

CROSS-REFERENCE TO RELATED APPLICATIONS

This application claims the benefit under 35 USC 119(a) of Korean Patent Application No. 10-2014-0077543 filed on Jun. 24, 2014, in the Korean Intellectual Property Office, the entire disclosure of which is incorporated herein by reference for all purposes.

BACKGROUND

1. Field

The following description relates to a method and apparatus for learning and estimating battery state information.

2. Description of Related Art

As a number of times a device powered by a rechargeable battery, that is, a secondary battery, is used increases, a battery life is reduced. Due to a reduction in the battery life, an initial battery capacity may not be guaranteed, and may be gradually reduced. When the capacity continues to be reduced, power, an operating time, and stability that are desired by a user may not be provided. Accordingly, replacement of the battery may be necessary.

A battery in a small-sized device, for example a mobile phone, may be easily replaced, or a great inconvenience may not occur even when a replacement time is not known in advance. On the other hand, an electric vehicle (EV) may require a relatively long time and a great expense to replace a battery. Accordingly, to determine a time to replace a battery, accurately determining a battery life is important.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of estimating battery state information includes collecting battery information; partitioning the collected battery information into interval information in a predetermined range; accumulating the interval information; and estimating the battery state information based on the accumulated interval information and learning information determined in advance.

The method may further include storing the learning information based on reference information of a battery.

The storing may include generating a parameter corresponding to the learning information based on the reference information and sample interval information into which sample battery information is partitioned in the predetermined range.

The generating may include learning the parameter by inputting the reference information and the sample interval information to a learner.

The estimating may include estimating the battery state information by inputting the accumulated interval information to the learner in which the parameter is learned.

The collecting may include measuring in real time any one or any combination of a voltage signal, a current signal, and a temperature signal of a battery.

The collecting may include determining, based on a current signal of the battery, whether the battery is being charged or discharged.

The method may further include transforming an input vector corresponding to the accumulated interval information so that a dimension of the input vector is reduced; and the estimating may include estimating the battery state information based on the transformed input vector and the learning information.

The partitioning may include setting a uniform interval in the predetermined range for each of the interval information.

The partitioning may include setting a narrow interval in the predetermined range for an interval having a high data generation probability or an interval having a low data generation probability in the battery information.

In another general aspect, a method of estimating battery state information includes accumulating a usage history of a battery, and estimating the battery state information based on the usage history and learning information determined in advance.

The accumulating may include partitioning the usage history into interval information in a predetermined range, and accumulating the interval information and storing the usage history for each interval.

The estimating may include estimating the battery state information by inputting the accumulated usage history to a learner configured to learn the learning information.

The learning information may include a parameter generated based on reference information of the battery and sample interval information into which sample battery information is partitioned in a predetermined range.

The accumulating may include accumulating a per-interval usage history of any one or any combination of a voltage signal, a current signal, and a temperature signal of the battery.

The method may further include transforming an input vector corresponding to the usage history so that a dimension of the input vector is reduced, and the estimating may include estimating the battery state information based on the transformed input vector and the learning information.

The accumulating may include determining, based on a current signal of the battery, whether the battery is being charged or discharged, and separately accumulating a usage history corresponding to charging of the battery and a usage history corresponding to discharging of the battery.

In another general aspect, an apparatus for estimating battery state information includes a collector configured to collect battery information; an accumulator configured to accumulate interval information into which the collected battery information is partitioned in a predetermined range; and an estimator configured to estimate the battery state information based on the accumulated interval information and learning information determined in advance.

The estimator may include a learner configured to output the battery state information using a parameter corresponding to the learning information in response to receiving the accumulated interval information.

The apparatus may further include an interface configured to transmit the estimated battery state information to an external device.

Other features and aspects will be apparent from the following detailed description, the drawings, and the claims.

DETAILED DESCRIPTION

Figure 1:
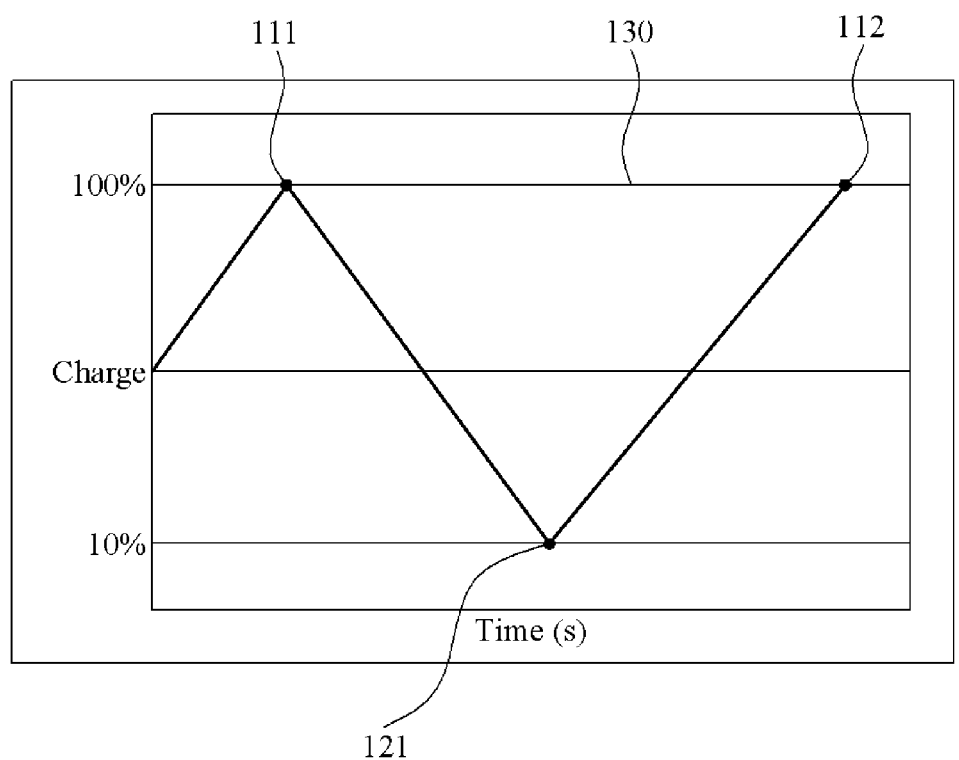
FIG. 1 illustrates an example of a charge and discharge (charge/discharge) cycle of a battery.

The following detailed description is provided to assist the reader in gaining a comprehensive understanding of the methods, apparatuses, and/or systems described herein. However, various changes, modifications, and equivalents of the methods, apparatuses, and/or methods described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 illustrates an example of a charge and discharge (charge/discharge) cycle of a battery.

In FIG. 1, points in time 111 and 112 at which the battery is maximally charged indicate "full charge," and a point in time 121 at which the battery is maximally discharged indicate "full discharge."

A single cycle associated with charging and discharging of the battery is a cycle in which power of a fully charged battery is completely discharged and the battery is charged again. For example, an interval 130 between the points in time 111 and 112 is a single cycle.

Figure 2:
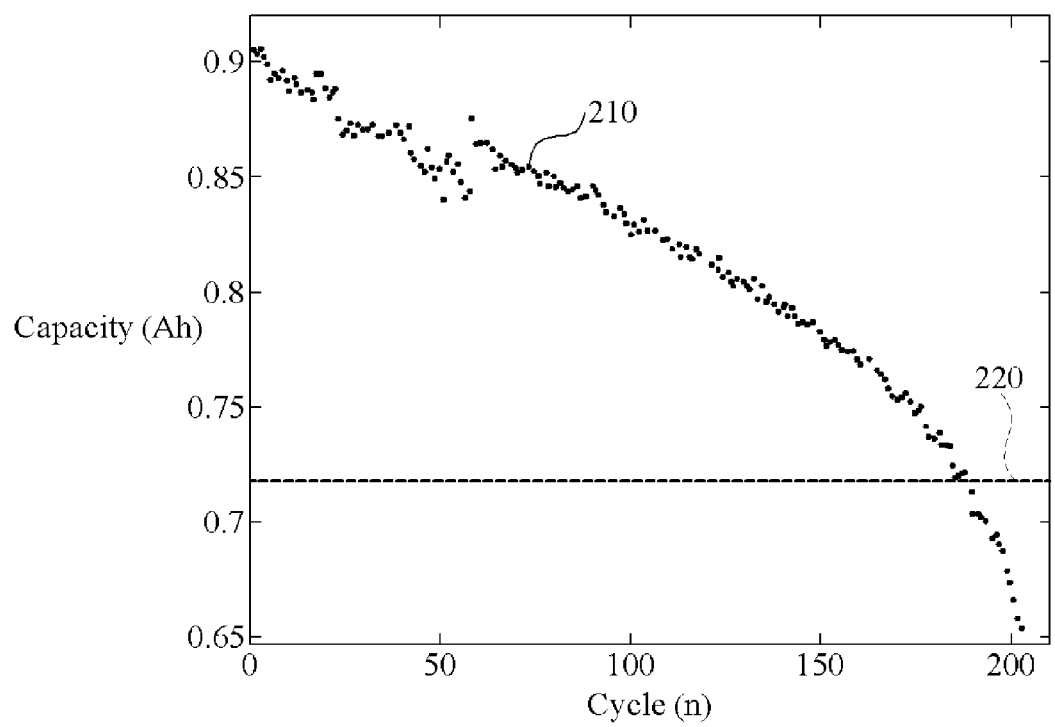
FIG. 2 illustrates an example of a reduction in a life of a battery due to an increase in a number of use cycles of the battery.

FIG. 2 illustrates an example of a reduction in a life of a battery due to an increase in a number of use cycles of the battery.

Referring to FIG. 2, when a number of cycles in which the battery is charged and discharged increases, the life of the battery is reduced. The life of the battery refers to a period of time during which the battery normally supplies power to an application. For example, the life of the battery may correspond to a capacity 210 of the battery. The capacity 210 indicates a maximum amount of charge that can be stored in the battery. When the capacity 210 is reduced below a threshold 220, the battery needs to be replaced because the battery does not satisfy a power requirement of an application. Accordingly, the life of the battery is highly relevant to a period of time during which the battery is used, and the use cycle of the battery.

Figure 3:
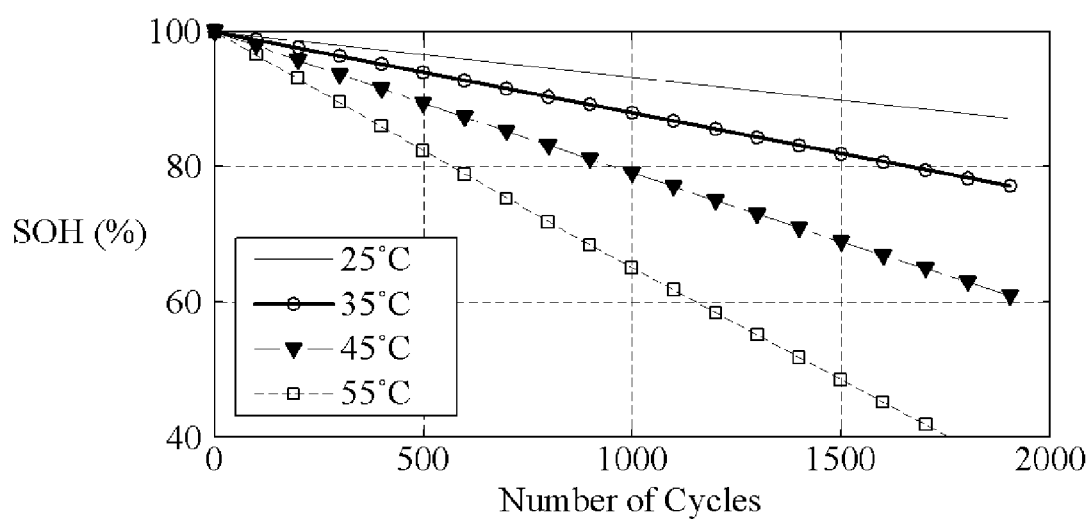
FIG. 3 illustrates an example of a reduction in a life of a battery based on a temperature at which the battery is used.

FIG. 3 illustrates an example of a reduction in a life of a battery based on a temperature at which the battery is used.

The life of the battery will typically be reduced due to a change in temperature when the battery is charged and discharged under the same conditions. Referring to FIG. 3, typically, the life of the battery operating at a higher temperature is more rapidly reduced. For example, when a number of use cycles of a battery increases, a life of the battery may be more rapidly reduced at 55°, compared to 25°. The life of the battery may be, for example, a state of health (SOH).

In the following description, a battery life may, for example, correspond to a current capacitance value, an internal resistance value, or an SOH. The SOH may be defined by the following Equation 1:

$$SOH = \frac{Capacity_{current}}{Capacity_{initial}} \quad (1)$$

Figure 4:
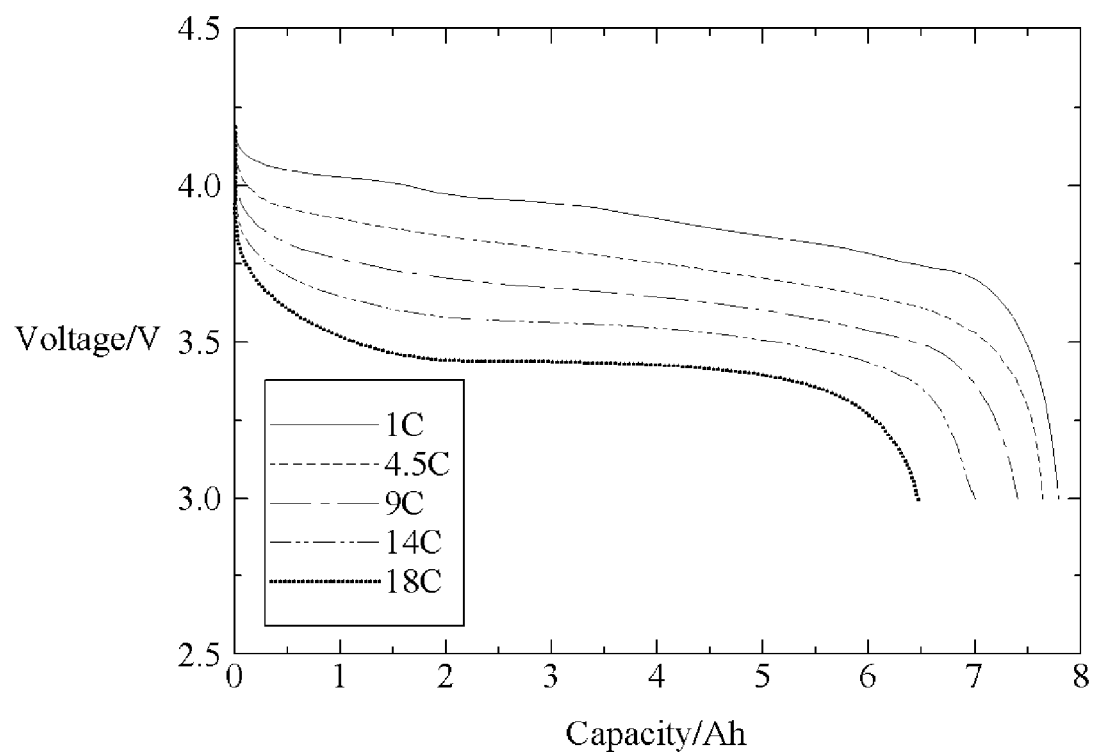
FIG. 4 illustrates an example of a reduction in a life of a battery based on a charge rate (C-rate).

FIG. 4 illustrates an example of a reduction in a life of a battery based on a charge rate (C-rate).

The C-rate is a unit used to set a current value under various use conditions during charging and discharging of a battery, and to predict or mark a period of time during which a battery is available. For example, the C-rate may be denoted as C, and may be defined by the following Equation 2:

$$C-\text{rate} = \frac{\text{Charge and discharge current}}{\text{Battery capacity}} \quad (2)$$

A graph of FIG. 4 shows a result obtained by performing a life test at various C-rates of a battery. Referring to FIG. 4, typically, when the C-rate increases, the life of the battery is rapidly reduced. The C-rate may be sensed together with a change in a voltage.

Figure 5:
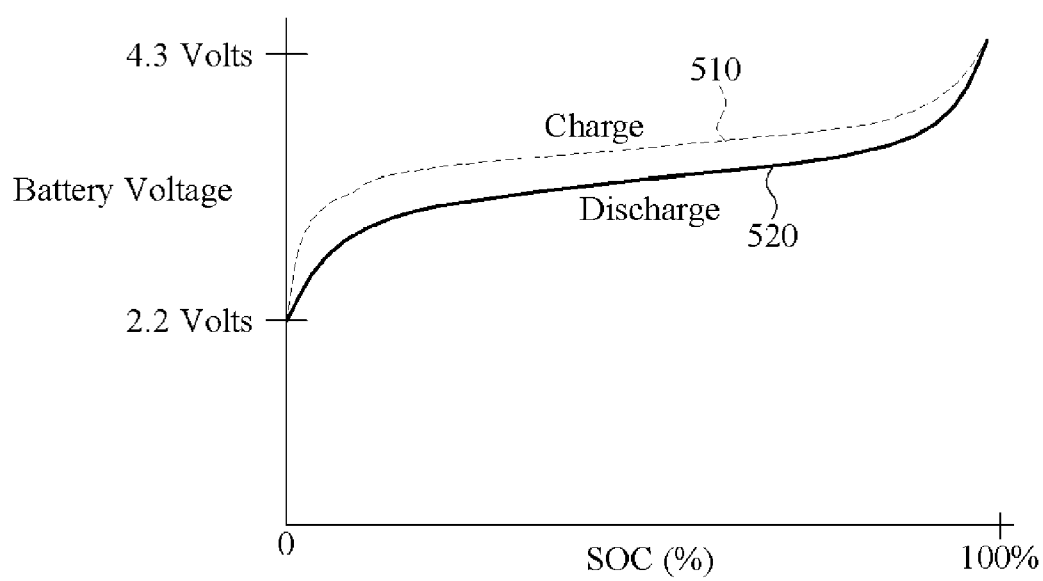
FIG. 5 illustrates an example of a voltage pattern based on charging and discharging of a battery.

FIG. 5 illustrates an example of a voltage pattern based on charging and discharging of a battery.

A voltage pattern or a current pattern may change depending on whether the battery is charging or discharging. For example, an influence of the same voltage value or the same current value on a life of the battery may be interpreted to be determined based on whether the battery is charged or discharged.

In FIG. 5, a voltage pattern 510 occurs on charging, and a voltage pattern 520 occurs on discharging. Referring to FIG. 5, different voltage values are sensed depending on whether the battery is being charged or discharged in the same state of charge (SOC).

Figure 6:
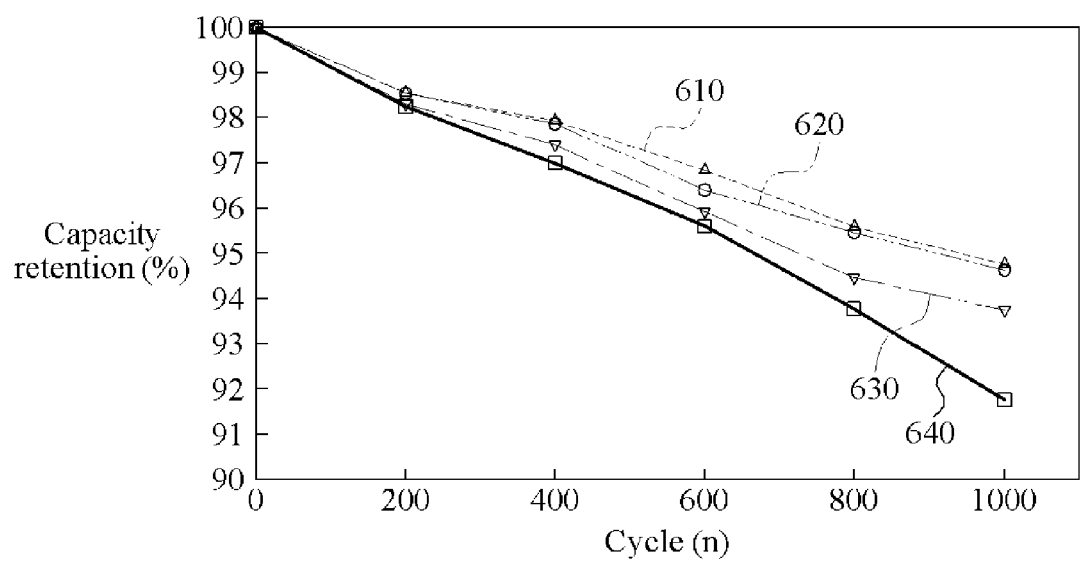
FIGS. 6 through 8 illustrate examples of a reduction in a life of a battery due to use of a battery for each voltage interval of the battery.
Figure 7:
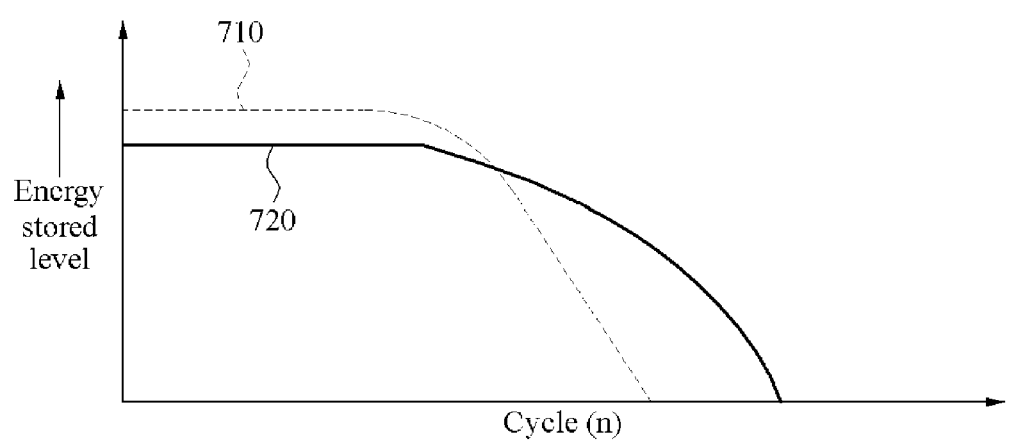
Figure 8:
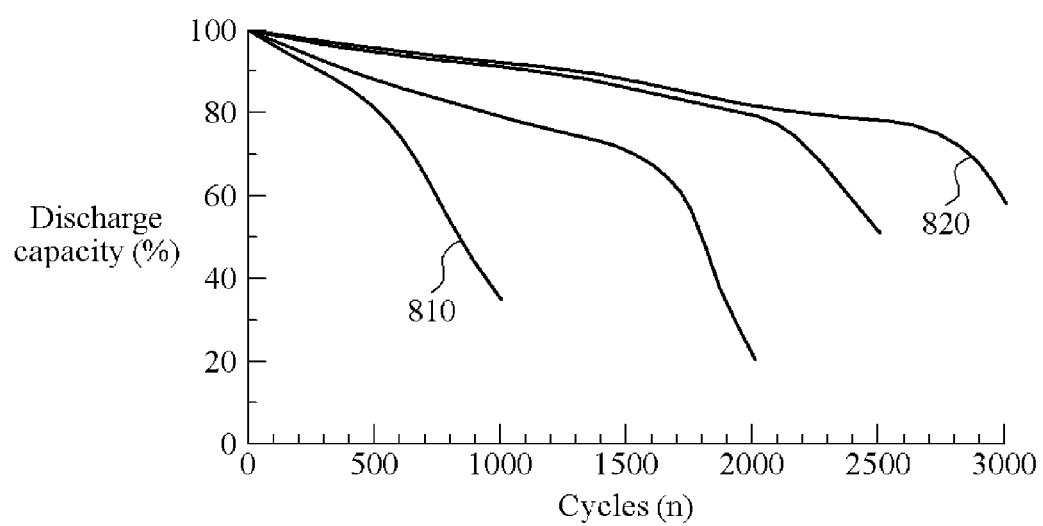

FIGS. 6 through 8 illustrate examples of a reduction in a life of a battery due to use of a battery for each voltage interval of the battery.

FIG. 6 illustrates an example of a battery capacity retention 610 corresponding to a battery voltage of 50% to 75%, a battery capacity retention 620 corresponding to a battery voltage of 25% to 50%, a battery capacity retention 630 corresponding to a battery voltage of 0% to 25%, and a battery capacity retention 640 corresponding to a battery voltage of 75% to 100%. As illustrated in FIG. 6, a life reduction effect, for example, an effect of reduction in a capacity retention, changes based on voltage intervals of the battery.

FIG. 7 illustrates an example of an energy stored level 710 based on use of a battery in a fully charged state, and an energy stored level 720 based on use of a battery in an 80% charged state. Accordingly, a life of a battery will be reduced less by using the battery in a partially charged state, instead of using the battery in a fully charged state.

FIG. 8 illustrates an example of a change in a battery life due to a change in a cut-off voltage. The cut-off voltage is a voltage at which charging or discharging is terminated. As illustrated in FIG. 8, a degree to which a discharge capacity 820 is reduced when the cut-off voltage is adjusted is less than a degree to which a discharge capacity 810 is reduced when the cut-off voltage is not adjusted.

Typically, to obtain a life of a secondary battery, an internal resistance of the secondary battery, or a change in a capacity of the secondary battery needs to be measured.

To measure an internal resistance, electrochemical impedance spectroscopy (EIS) is typically used. The EIS may be used to measure an internal resistance of a battery by applying a small amount of current to the battery. However, to estimate a state of a battery of an electric vehicle (EV) using the EIS, the EV needs to move to a charging station.

When the battery is used to move the EV, an accuracy of measuring the state of the battery will be reduced due to unstable internal materials of the battery. Accordingly, after movement of the EV, the EV needs to wait for a relatively long period of time in an idle state until the battery reaches a stable state.

Because the battery occupies a largest portion of the EV, the SOH of the battery needs to be accurately estimated. It is an important factor in determining a value of the EV as a used car as well as a new car.

In one example, a state of a battery (for example, an SOH) that is an energy source of an EV is accurately estimated. Exact state information of EVs may be provided to drivers of EVs by more accurately estimating an SOH, and accordingly, a negative feeling about EVs compared to gasoline powered vehicles may be alleviated. Additionally, an apparatus for learning and estimating battery state information may be lightened in weight, and may be mounted in a battery management system (BMS). Furthermore, the apparatus may reduce a time required to estimate a state of a battery. The apparatus may be applicable to all applications employing batteries, in addition to EVs.

Figure 9:
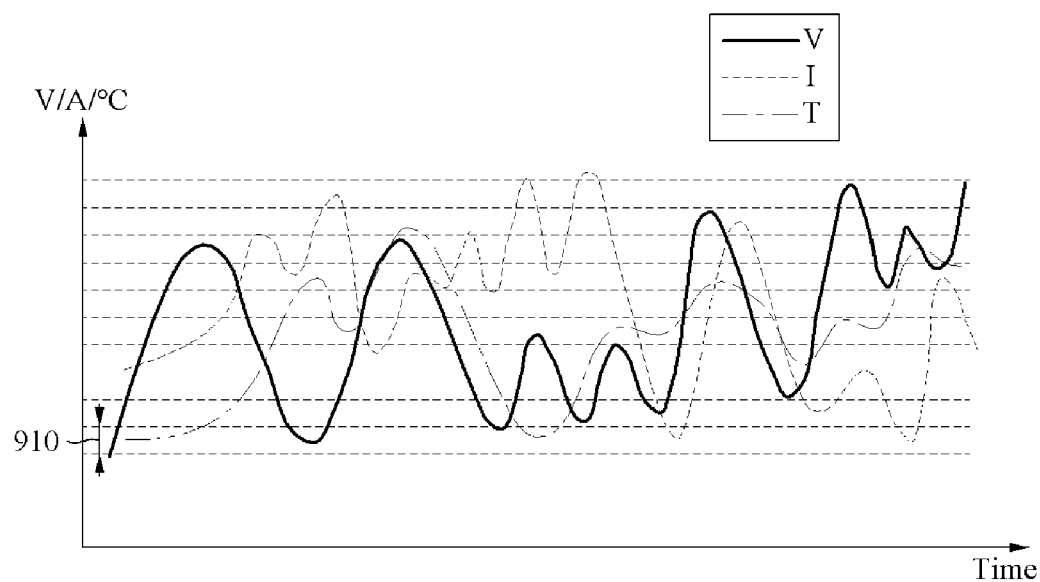
FIG. 9 illustrates an example of battery information collected from a battery.
Figure 10:
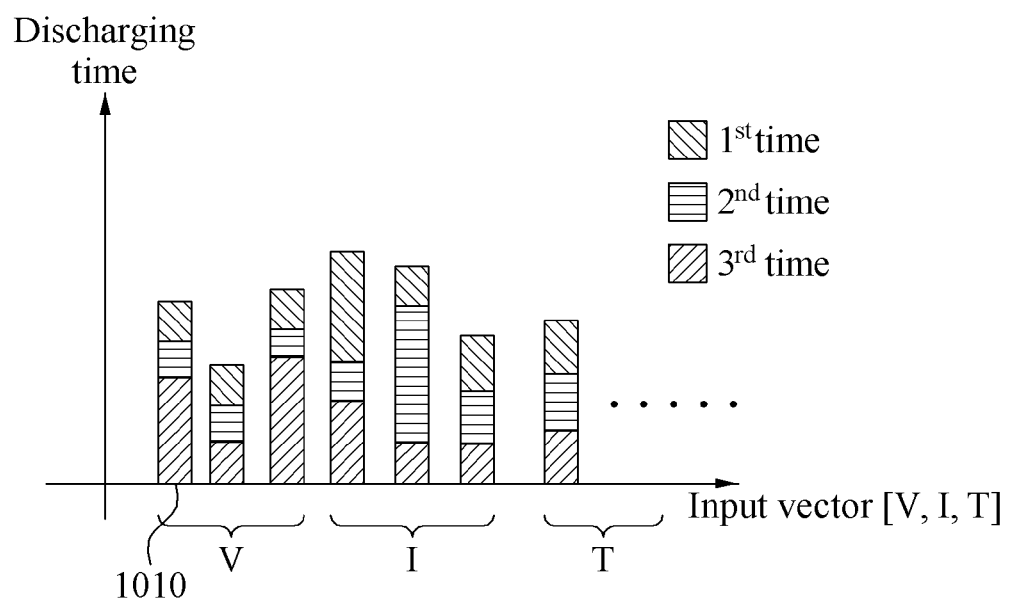
FIG. 10 illustrates an example of cumulative information obtained by accumulating interval information into which battery information is partitioned.

FIG. 9 illustrates an example of battery information collected from a battery. FIG. 10 illustrates an example of cumulative information obtained by accumulating interval information into which battery information is partitioned.

In the following description, battery information may be all information collectable from a battery, and may include, for example, a voltage signal, a current signal, or a temperature signal that may be measured from a battery.

Additionally, in the following description, battery state information may be, for example, an expected life of a battery, but is not limited thereto, and accordingly may be applicable to other battery state information.

In one example, when a battery is frequently used, a life of the battery may be reduced. Accordingly, the reduced life of the battery may have a high relevance to a usage history of the battery. For example, an apparatus for learning battery state information may accumulate amounts of time during which a battery is used for each of a plurality of intervals in a predetermined range of each of a voltage, a current, and a temperature. The predetermined ranges are represented by the dividing lines of FIG. 9. The accumulated amounts of time may be, for example, each of elements of an input vector of FIG. 10. In this example, battery state information corresponding to interval information accumulated for each interval is used as learning information for a learner, and accordingly the apparatus may acquire battery state information corresponding to a usage history of the battery. The battery state information may be, for example, an SOH of the battery.

The learning information may be information learned by the learner from the usage history of the battery. For example, the learner may include a black-box function. When an input and output of the black-box function are given, the learner learns a parameter of the black-box function to generate an output corresponding to the input. The learning information may include, for example, a parameter or a type of the learner.

In FIG. 9, a voltage signal, a current signal, and a temperature signal of the battery as collected battery information are illustrated with respect to an axis representing time. The voltage signal, the current signal, and the temperature signal are partitioned into interval information in the predetermined ranges of FIG. 9, and the interval information is accumulated as illustrated in FIG. 10. The accumulated interval information is represented as an input vector. The dashed lines of FIG. 9 represent predetermined ranges used to partition battery information.

The input vector is a set of data corresponding to the accumulated interval information of the battery information. The interval information, into which the battery information is partitioned in the predetermined ranges, is battery information corresponding to a predetermined interval. Additionally, the interval information includes information on a period of time during which the battery operates in a predetermined interval.

For example, every time a voltage signal (for example, interval information) corresponding to a predetermined interval 910 of FIG. 9 is measured, an amount of time during which the voltage signal is measured is accumulated in an element 1010 of the input vector of FIG. 10. For example, in FIG. 10, the voltage signal corresponding to the predetermined interval 910 is measured three times (for example, a 1st time, a 2nd time, and a 3rd time). When the voltage signal is assumed to be measured during the 1st time for 11 seconds, measured during the 2nd time for 10 seconds, and measured during the 3rd time for 30 seconds, a value of the element 1010 corresponds to 11+10+30=51 seconds as a cumulative measurement time. The element 1010 corresponds to the predetermined interval 910. An amount of time in which the voltage signal is measured is merely an example in FIGS. 9 and 10, and is not limited thereto. Also, the voltage signal is measured three times in FIGS. 9 and 10, but a number of times the voltage signal is measured is not limited to three. In this application, "adding an amount of time during which battery information (for example, interval information) corresponding to a predetermined interval is measured to an element of an input vector" corresponds to "accumulating interval information."

For convenience of description, three elements are illustrated for each of accumulated interval information corresponding to the voltage signal, accumulated interval information corresponding to the current signal, and accumulated interval information corresponding to the temperature signal in FIG. 10, but the number of elements is not limited to three. Accordingly, the interval information may be distinguished from one other based on a number of intervals in a predetermined range, and may be accumulated.

FIGS. 11 through 14 illustrate examples of battery information partitioned in a predetermined range.

Figure 11:
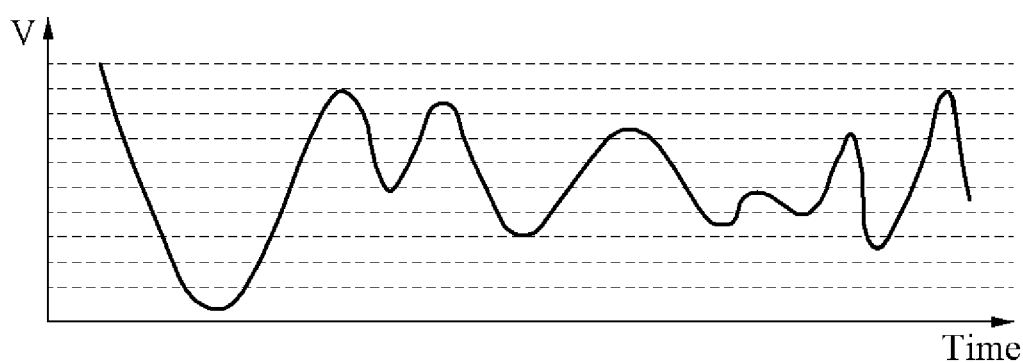
FIGS. 11 through 14 illustrate examples of battery information partitioned in a predetermined range.
Figure 12:
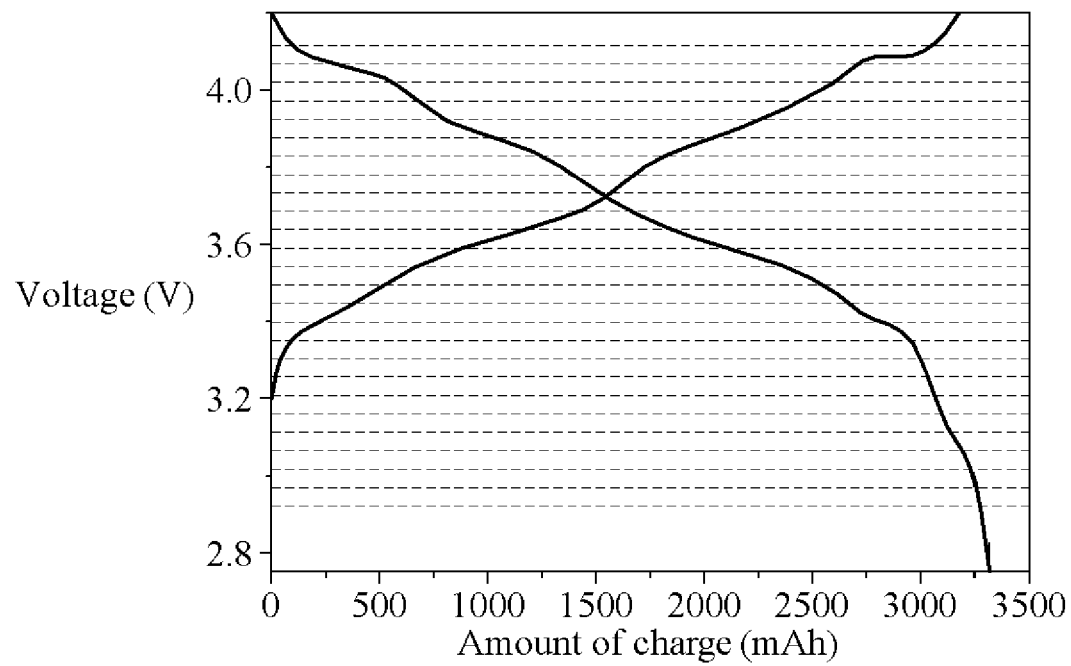
Figure 13:
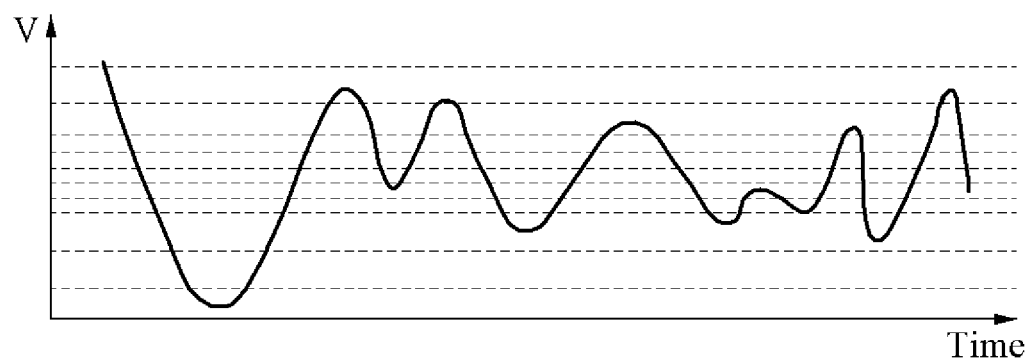
Figure 14:
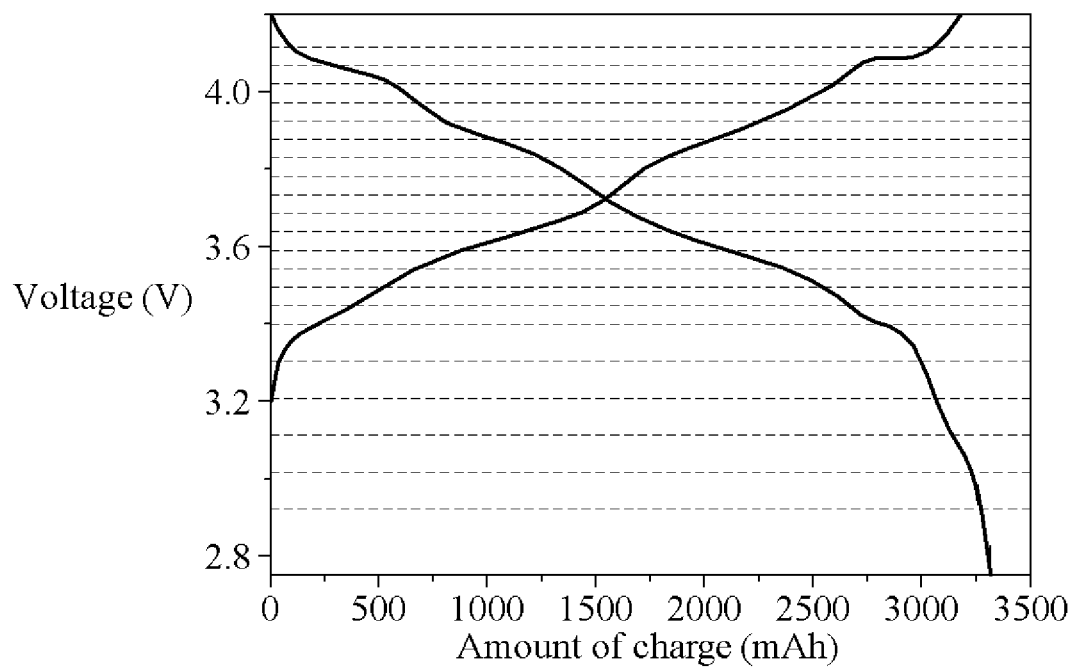

Referring to FIGS. 11 and 12, uniform intervals in a predetermined range are set for interval information into which battery information is partitioned. Referring to FIGS. 13 and 14, nonuniform intervals in a predetermined range are set for interval information into which battery information is partitioned. In each of FIGS. 11 through 14, the dashed lines represent predetermined intervals into which battery information is partitioned.

The predetermined range may be a range in which intervals for classifying battery information are set in advance.

FIGS. 11 and 13 illustrate examples of a change in a voltage with respect to time. FIGS. 12 and 14 illustrate examples of a change in a voltage with respect to an amount of charge stored in a battery during charging and discharging of the battery.

Referring to FIG. 13, in a middle portion of the predetermined range, relatively narrow intervals are set for collected battery information. The battery information may include, for example, a measured voltage signal, a measured current signal, and a measured temperature signal.

Typically, a secondary battery will stably operate at a voltage signal in an interval of 3.5 volts (V) to 3.7 V, and accordingly a voltage may be rapidly reduced when a battery is used at 4.2 V or 2.5 V. Thus, based on a resolution of a sensor, narrower intervals may be set for middle intervals, and wider intervals may be set for boundary intervals.

Referring to FIG. 14, narrow intervals in a predetermined range may be set for an interval with a high data generation probability in the battery information. In FIG. 14, an interval in which a voltage rapidly changes with respect to an amount of charge in the battery may be determined as an interval having a low data generation probability, and accordingly a relatively wide interval may be set.

However, the interval is not limited thereto. For example, a narrow interval may be set for an interval having a low data generation probability, and a wide interval may be set for an interval having a high data generation probability.

Figure 15:
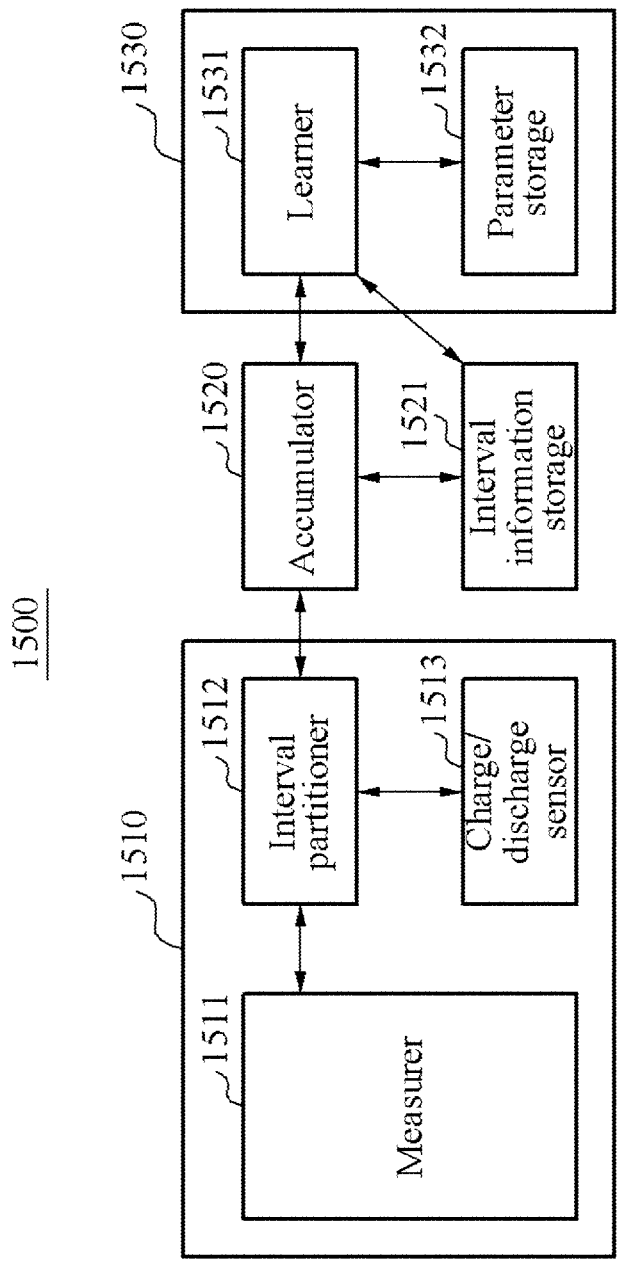
FIG. 15 illustrates an example of an apparatus for learning and estimating battery state information.

FIG. 15 illustrates an example of an apparatus 1500 for learning and estimating battery state information.

Referring to FIG. 15, the apparatus 1500 includes a collector 1510, an accumulator 1520, an interval information storage 1521, and an estimator 1530.

The collector 1510 collects battery information. The collector 1510 includes a measurer 1511, an interval partitioner 1512, and a charge/discharge sensor 1513.

The measurer 1511 measures battery information from a battery using a sensor, or collects sample battery information from battery data stored in advance. The sensor may measure, as battery information, a voltage signal, a current signal, and a temperature signal, and may acquire all information associated with the battery, as battery information.

The interval partitioner 1512 partitions the collected battery information into interval information in a predetermined range. The interval information into which the battery information is partitioned in the predetermined range is battery information corresponding to a predetermined interval. Additionally, the interval information may include information on a period of time during which the battery operates in the predetermined interval.

The charge/discharge sensor 1513 determines, based on the collected battery information, whether the battery is being charged or discharged.

The accumulator 1520 accumulates the interval information into which the battery information is partitioned. The accumulated interval information may be transferred to the estimator 1530 in the form of an input vector. The accumulator 1520 also accumulates a usage history of the battery.

The interval information storage 1521 stores the interval information accumulated by the accumulator 1520.

The estimator 1530 estimates the battery state information based on the accumulated interval information and learning information that is determined in advance. Also, the estimator 1530 estimates the battery state information based on the accumulated usage history and the learning information. The estimator 1530 includes a learner 1531 and a parameter storage 1532. The learning information includes a parameter determined by a learner.

The battery state information is information indicating a state of a battery, and may include, for example, an expected life (SOH) and a remaining driving range of the battery (SOC). The expected life may be, for example, a battery life estimated indirectly by the estimator 1530. Reference information is state information used as a criterion to learn and estimate a state of a battery, and may include, for example, an actual life, and a battery life that is extracted from battery data stored in advance. The actual life may be, for example, a battery life measured directly from a battery using an EIS.

The learner 1531 receives, as an input, the accumulated interval information, and outputs the battery state information using a parameter corresponding to the learning information.

The parameter storage 1532 stores learning information determined by the learner 1531 to estimate the battery state information based on the accumulated interval information and the reference information of the battery. The reference information of the battery may include, for example, an actual life (for example, an SOH measured directly from a battery), or an SOH extracted from battery data stored in advance.

Additionally, the apparatus 1500 may operate as an apparatus for estimating battery state information, or as an apparatus for learning battery state information. For example, an apparatus 1600 for learning battery state information of FIG. 16, and an apparatus 1700 for estimating battery state information of FIG. 17 may be independently configured.

Figure 16:
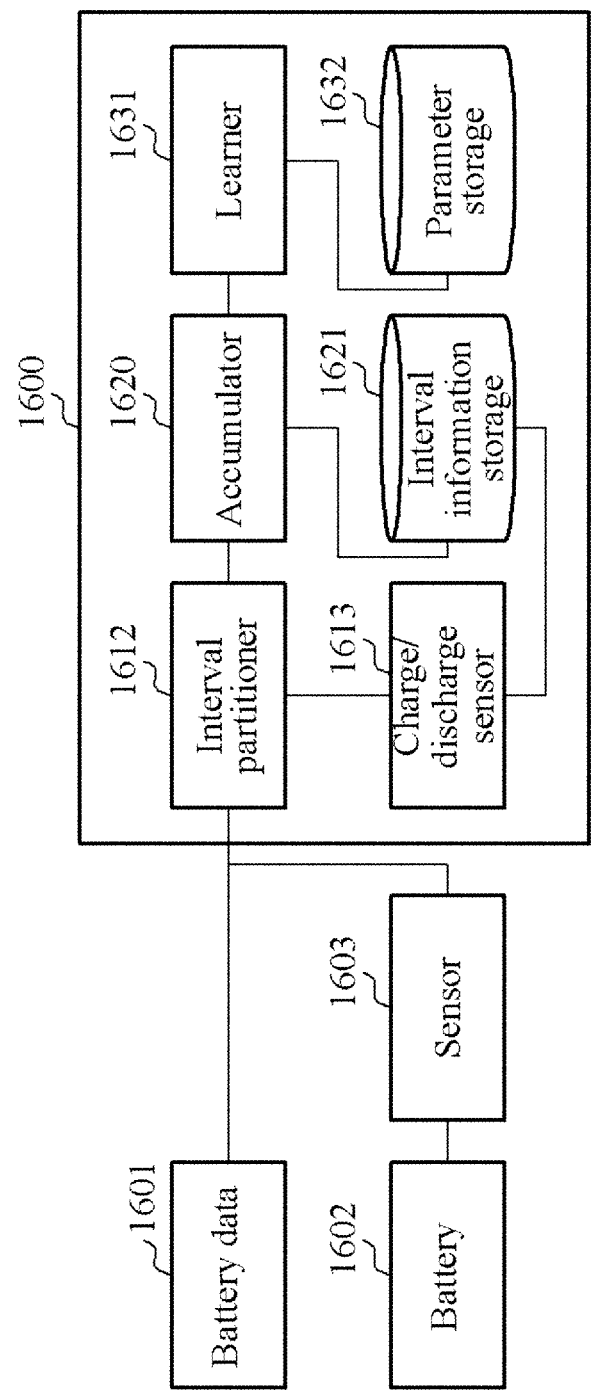
FIG. 16 illustrates an example of an apparatus for learning battery state information.

FIG. 16 illustrates an example of the apparatus 1600 for learning battery state information.

The apparatus 1600 of FIG. 16 may use battery data 1601 that is stored in advance, or may measure battery information from a battery 1602 using a sensor 1603.

An interval partitioner 1612 receives collected battery information, for example, a voltage signal, a current signal, a temperature signal, of the battery 1602. The interval partitioner 1612 partitions the received battery information in the predetermined range to generate interval information including information on a period of time during which the battery 1602 is used in a predetermined interval in the battery information. The interval partitioner 1612 partitions each of the current signal, the voltage signal, and the temperature signal into interval information corresponding to the predetermined range, and intervals in the predetermined range may be uniform or nonuniform.

An accumulator 1620 receives the interval information from the interval partitioner 1612, and accumulates interval information for each of a plurality of intervals in the predetermined range. The accumulated interval information is stored in an interval information storage 1621.

A charge/discharge sensor 1613 determines whether the battery 1602 is being charged or discharged based on a value of the measured current signal of the battery 1602.

A learner 1631 receives the accumulated interval information in the form of an input vector, and acquires an SOH corresponding to the input vector. Additionally, the learner 1631 determines a parameter corresponding to a learning model from the input vector and the SOH. The parameter determined by the learner 1631 is stored in a parameter storage 1632.

The learner 1631 includes, for example, a neural network, a hidden Markov model (HMM), a Bayesian network, a support vector machine (SVM), or a decision tree (DT) as a machine learning module used to estimate battery state information. All of these learning techniques are well known to one of ordinary skill in the art, and thus will not be further described here. Furthermore, any other learning technique known to one of ordinary skill in the art may be used.

Figure 17:
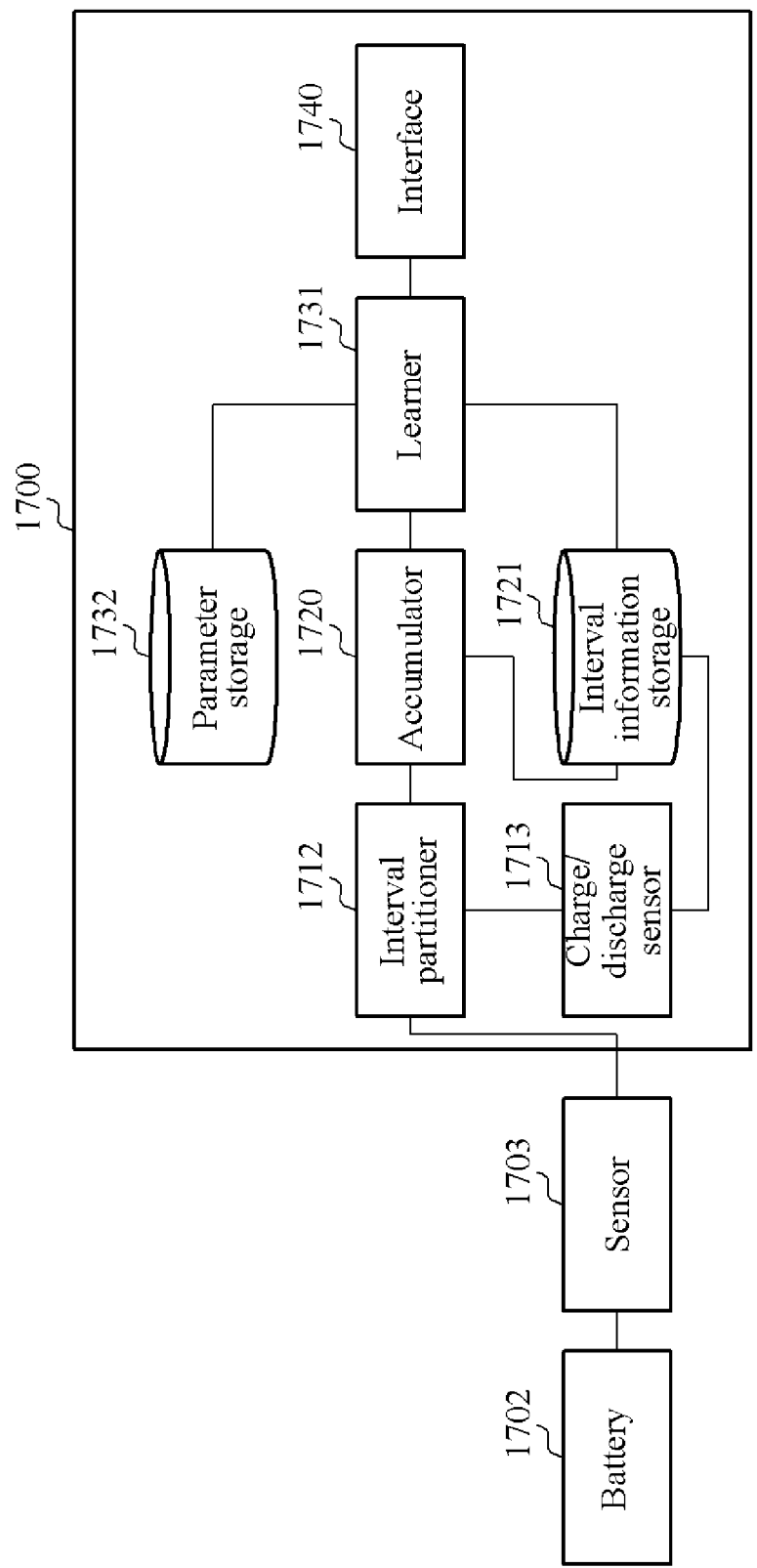
FIG. 17 illustrates an example of an apparatus for estimating battery state information.

FIG. 17 illustrates an example of the apparatus 1700 for estimating battery state information.

The apparatus 1700 of FIG. 17 is configured similarly to the apparatus 1600 of FIG. 16. For example, the apparatus 1700 may be included in a BMS mounted in an EV.

Unlike the apparatus 1600, the apparatus 1700 acquires, using a sensor 1703, collected battery information in real time, instead of using battery data that is stored in advance. A charge/discharge sensor 1713 determines whether the battery 1702 is being charged or discharged.

The apparatus 1700 partitions battery information or a usage history into interval information in a predetermined range, using an interval partitioner 1712, similarly to the interval partitioner 1612 of FIG. 16. An accumulator 1720 accumulates the interval information, and stores store a per-interval usage history of the battery 1702 in an interval information storage 1721. For example, the accumulator 1720 may store a per-interval usage history of one or any combination of a voltage signal, a current signal, and a temperature signal of the battery 1702. A parameter storage 1732 stores the same parameter as the parameter stored in the parameter storage 1632 of FIG. 16. The apparatus 1700 estimates, using a learner 1731, battery state information (for example, an SOH) based on learning information determined in advance, and an input vector corresponding to the accumulated interval information (for example, a per-interval usage history).

Additionally, an interface 1740 transmits the estimated battery state information to an external device. The external device includes, for example, a dashboard of an EV.

Figure 18:
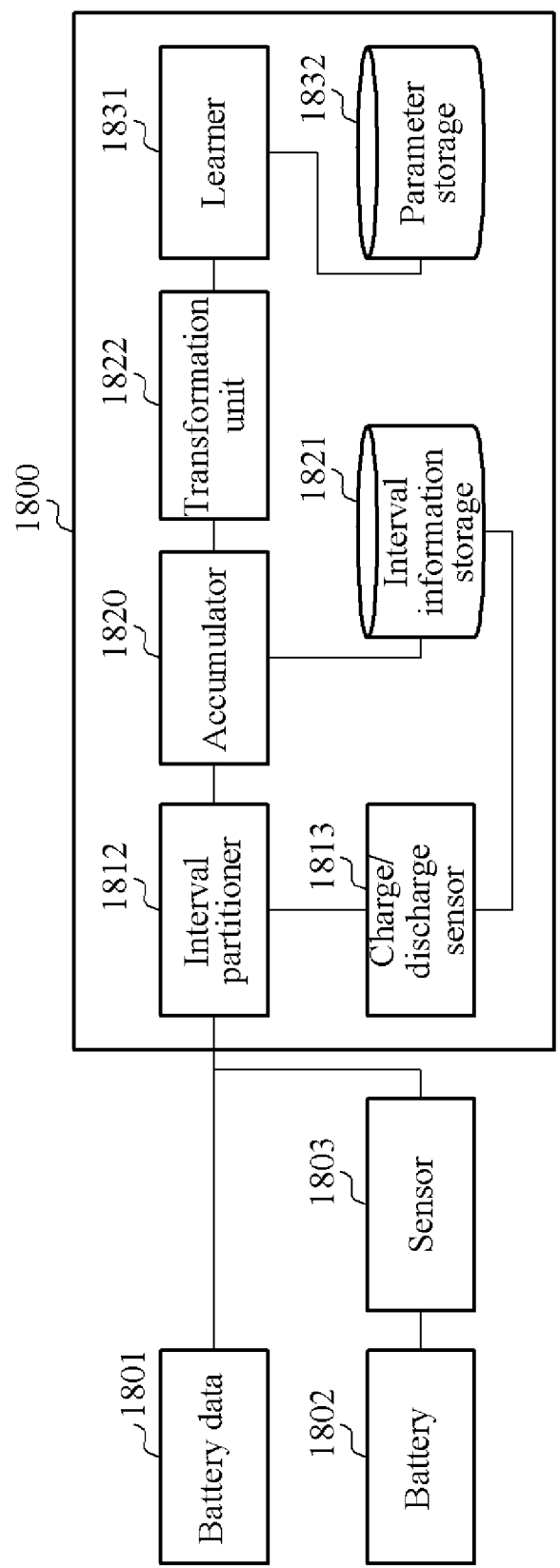
FIGS. 18 and 19 respectively illustrate another example of an apparatus for learning battery state information, and another example of an apparatus for estimating battery state information.
Figure 19:
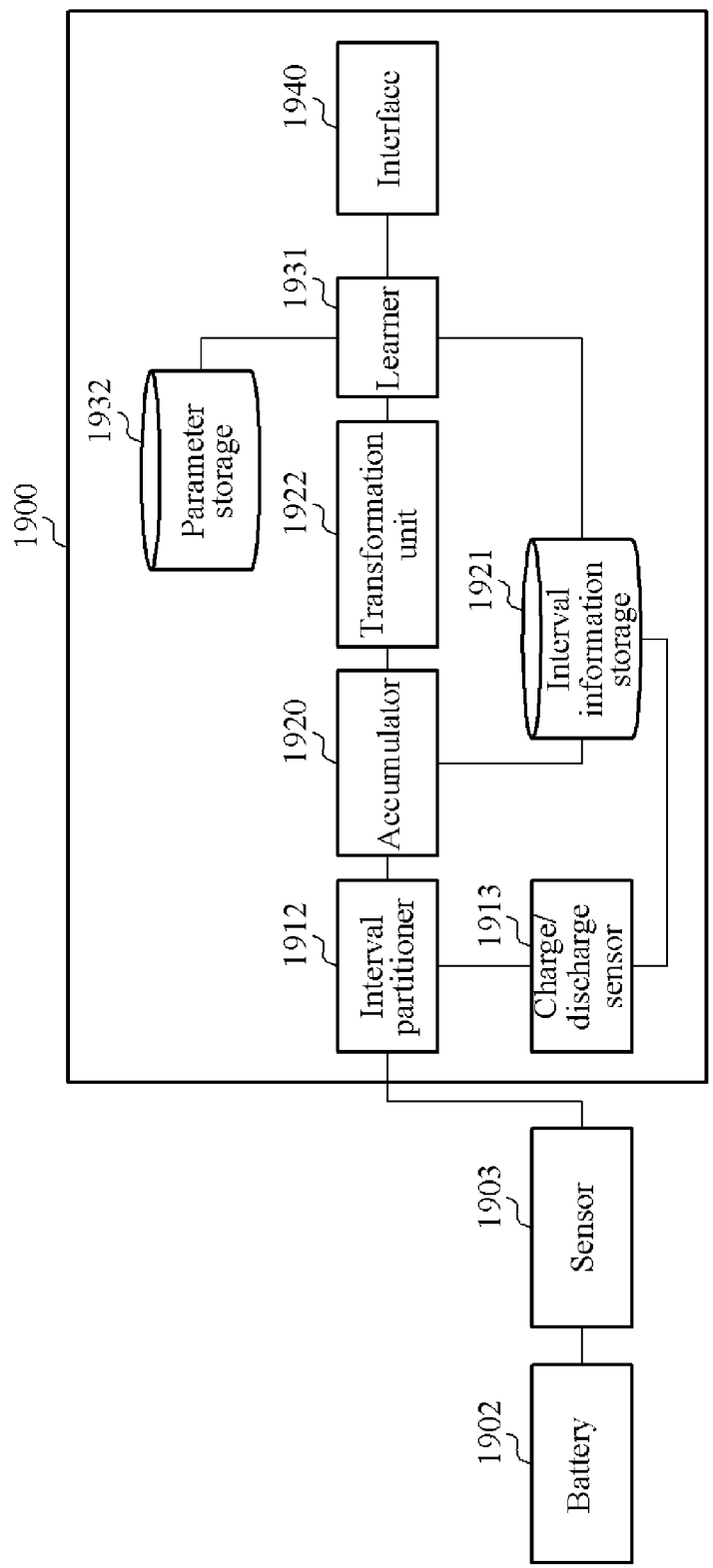

FIGS. 18 and 19 respectively illustrate another example of an apparatus 1800 for learning battery state information, and another example of an apparatus 1900 for estimating battery state information.

Battery data 1801, a battery 1802, a sensor 1803, an interval partitioner 1812, a charge/discharge sensor 1813, an accumulator 1820, an interval information storage 1821, a learner 1831, and a parameter storage 1832 in the apparatus 1800 of FIG. 18 are configured similarly to the apparatus 1600 of FIG. 16. Additionally, a battery 1902, a sensor 1903, an interval partitioner 1912, a charge/discharge sensor 1913, an accumulator 1920, an interval information storage 1921, a learner 1931, a parameter storage 1932 and an interface 1940 in the apparatus 1900 of FIG. 19 are configured similarly to the apparatus 1700 of FIG. 17.

The apparatus 1800 further includes a transformation unit 1822, and the apparatus 1900 further includes a transformation unit 1922.

The transformation units 1822 and 1922 transform an input vector corresponding to accumulated interval information to reduce a dimension of the input vector. By reducing the dimension of the input vector, a learning time of the apparatus 1800 is reduced. For example, the transformation units 1822 and 1922 may minimize a loss of information caused by the reduction in the dimension of the input vector using a principal component analysis (PCA) or any other suitable technique known to one of ordinary skill in the art. The apparatus 1900 may use learning information determined by the apparatus 1800.

Figure 20:
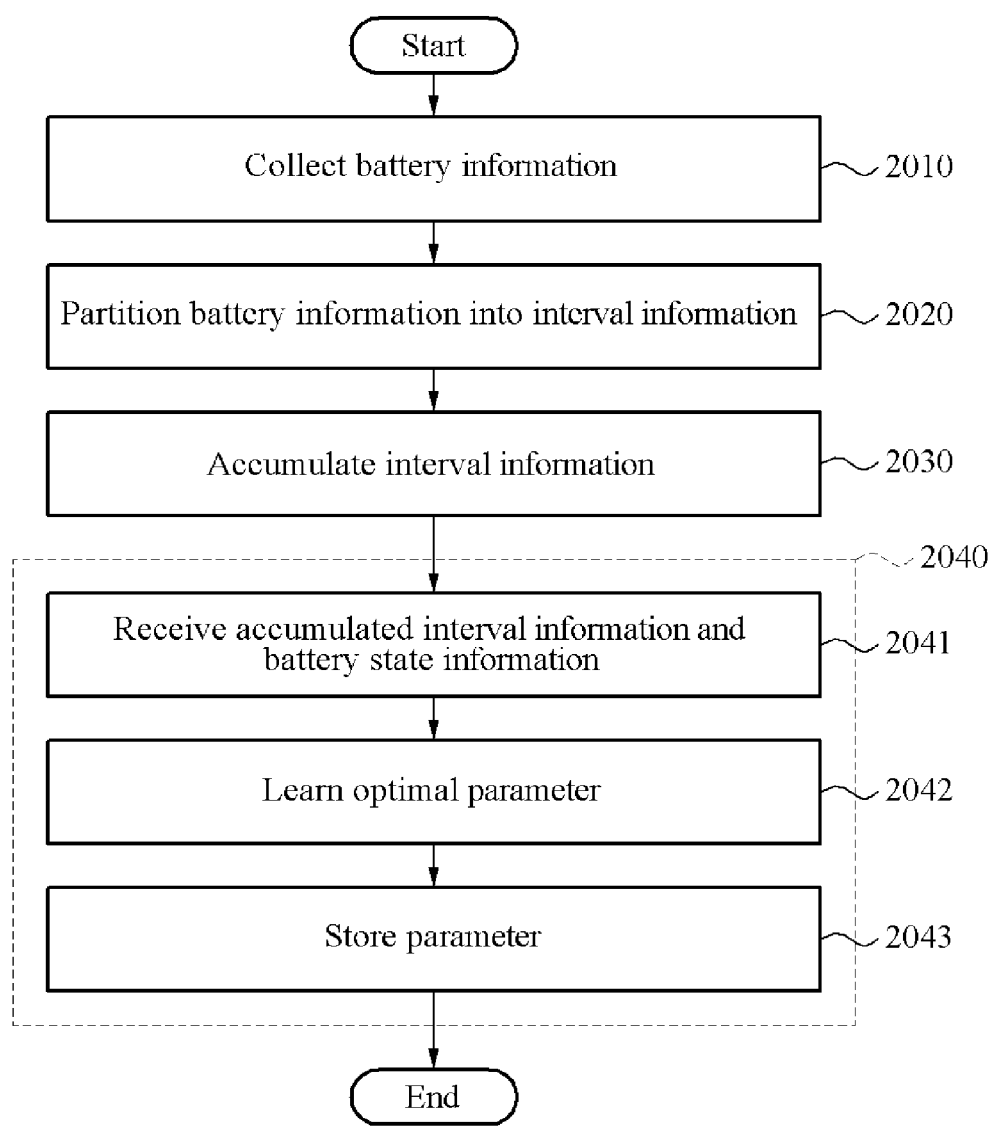
FIG. 20 illustrates an example of a method of learning battery state information.

FIG. 20 illustrates an example of a method of learning battery state information.

Referring to FIG. 20, in operation 2010, a collector of an apparatus for learning battery state information collects battery information. For example, the collector measures, in real time, any one or any combination of a voltage signal, a current signal, a temperature signal, and reference information of a battery. Additionally, the collector may collect sample battery information from battery data stored in advance. The sample battery information may be a portion of the battery data, and may be data obtained by simulating driving information of a vehicle according to a related art. The driving information may include, for example, an urban dynamometer driving schedule (UDDS) profile.

The collector determines, based on the current signal, whether the battery is being charged or discharged.

In operation 2020, an interval partitioner of the apparatus for learning battery state information partitions the battery information into interval information. For example, the interval partitioner partitions the battery information in a predetermined range. The interval partitioner partitions a predetermined interval of the predetermined range among the battery information into interval information, and the interval information includes a period of time during which the battery operates in the predetermined interval. Additionally, the interval partitioner may partition sample battery information into sample interval information in a predetermined range. The sample interval information may include information corresponding to a predetermined interval of the sample battery information, and a period of time during which the battery operates in the predetermined interval.

In operation 2030, an accumulator of the apparatus for learning battery state information accumulates the interval information. For example, the accumulator adds a period of time during which the battery operates in a predetermined interval corresponding to the interval information to an element corresponding to the predetermined interval among elements of an input vector.

In operation 2040, a learner of the apparatus for learning battery state information determines learning information to estimate battery state information.

In operation 2041, the learner receives, as inputs, the accumulated interval information and the battery state information. For example, the reference information is input to the learner.

In operation 2042, the learner learns an optimal parameter based on the accumulated interval information and the battery state information. For example, the learner learns a parameter optimized for a learning model used in the learner based on the battery state information and the input vector corresponding to the accumulated interval information. The learner may include, for example, any one of a neural network, an HMM, a Bayesian network, an SVM, and a DT. All of these learning techniques are well known to one of ordinary skill in the art, and thus will not be further described here. Furthermore, any other learning technique known to one of ordinary skill in the art may be used.

In operation 2043, a parameter storage of the apparatus for learning battery state information stores the determined parameter. The parameter stored in the parameter storage is used to estimate the battery state information.

Figure 21:
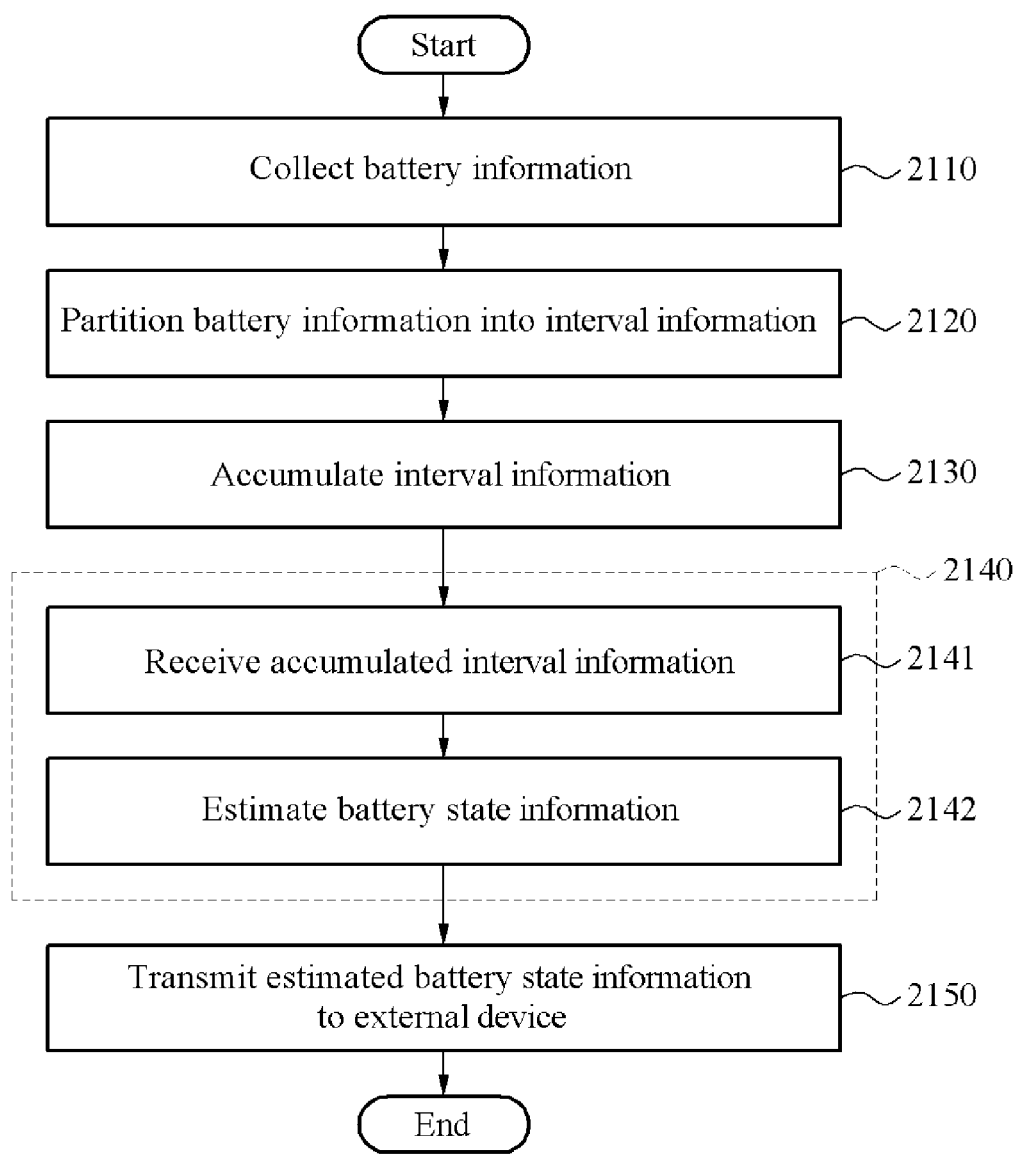
FIG. 21 illustrates an example of a method of estimating battery state information.

FIG. 21 illustrates an example of a method of estimating battery state information.

Referring to FIG. 21, in operation 2110, a collector of an apparatus for estimating battery state information collects battery information. For example, the collector measures, in real time, any one or any combination of a voltage signal, a current signal, and a temperature signal of a battery. Additionally, the collector determines, based on the current signal, whether the battery is being charged or discharged.

In operation 2120, an interval partitioner of the apparatus for estimating battery state information partitions the battery information into interval information. For example, the interval partitioner partitions the battery information into interval information in a predetermined range. In the predetermined range, a uniform interval may be set for each of the interval information into which the battery information is partitioned. Additionally, in the predetermined range, a narrow interval may be set for an interval having a high data generation probability in the battery information, but other settings are also possible. For example, a narrow interval in a predetermined range may be set for an interval having a low data generation probability in the battery information.

In operation 2130, an accumulator of the apparatus for estimating battery state information accumulates the interval information. For example, the accumulator adds a period of time during which the battery operates in a predetermined interval corresponding to interval information to an element corresponding to the predetermined interval among elements of an input vector. For example, the accumulator adds a cumulative usage history of a corresponding interval using a timer. Furthermore, the accumulator may independently accumulate interval information corresponding to a battery being charged, and interval information corresponding to a battery being discharged. For example, the accumulator may determine, based on the current signal of the battery, whether the battery is being charged or discharged, and may separately accumulate a usage history corresponding to charging of the battery and a usage history corresponding to discharging of the battery.

In operation 2140, an estimator of the apparatus for estimating battery state information estimates battery state information.

In operation 2141, a learner of the apparatus for estimating battery state information receives, as an input, the accumulated interval information.

In operation 2142, the learner estimates the battery state information based on the accumulated interval information and a pre-stored parameter (for example, learning information determined in advance). The apparatus for estimating battery state information estimates the battery state information by inputting the accumulated interval information and the accumulated usage histories to the learner in which the parameter is learned. The battery state information is information associated with a state of the battery, and may include, for example, information on a life of the battery. The life of the battery may be a current SOH, or a remaining useful life.

For example, a parameter storage of the apparatus for estimating battery state information stores learning information determined in advance based on reference information of the battery to provide the learning information to the learner. The learner generates a parameter corresponding to the learning information based on the reference information, and sample interval information into which sample battery information is partitioned in a predetermined range. The sample interval information and the reference information are input to the learner, and the parameter is learned.

In operation 2150, an interface of the apparatus for estimating battery state information transmits the estimated battery state information to an external device. The external device may include, for example, a dashboard of an EV. Additionally, the estimated battery state information may be transferred to a user or another system via a communication interface in a vehicle. For example, via a wired or wireless communication, the interface may transmit the estimated battery state information to an external device.

Figure 22:
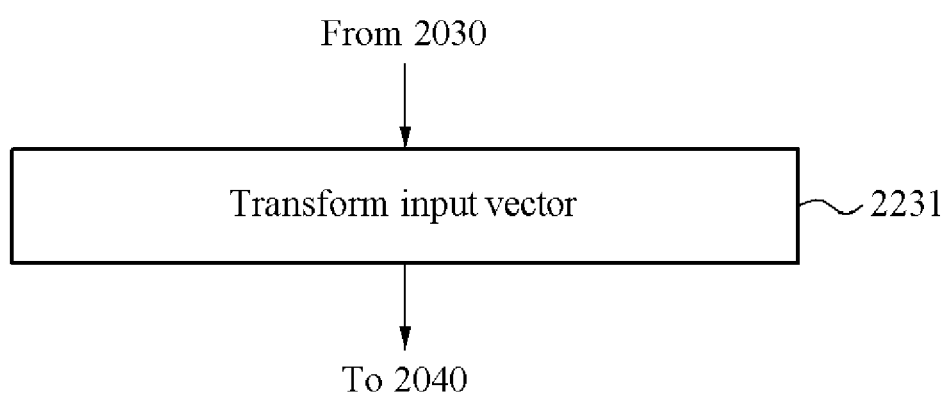
FIGS. 22 and 23 illustrates examples of an operation of transforming an input vector.
Figure 23:
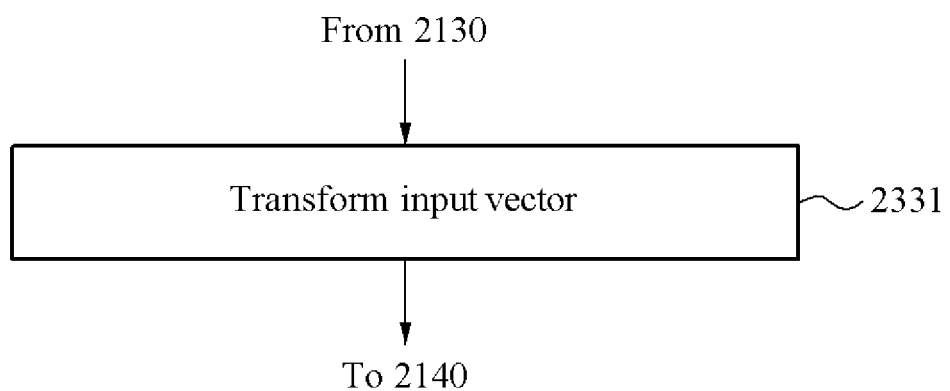

FIGS. 22 and 23 illustrate examples of an operation of transforming an input vector.

In operation 2231, a transformation unit of the apparatus for learning battery state information transforms an input vector. In operation 2331, a transformation unit of the apparatus for estimating battery state information transforms an input vector. For example, each of the transformation units transform the input vector so that a dimension of the input vector corresponding to the accumulated interval information and the accumulated usage history is reduced. Each of the transformation units may minimize a loss in information caused by a reduction in the dimension of the input vector by applying a PCA or any other suitable technique known to one of ordinary skill in the art. The input vector will be further described with reference to FIG. 24.

Figure 24:
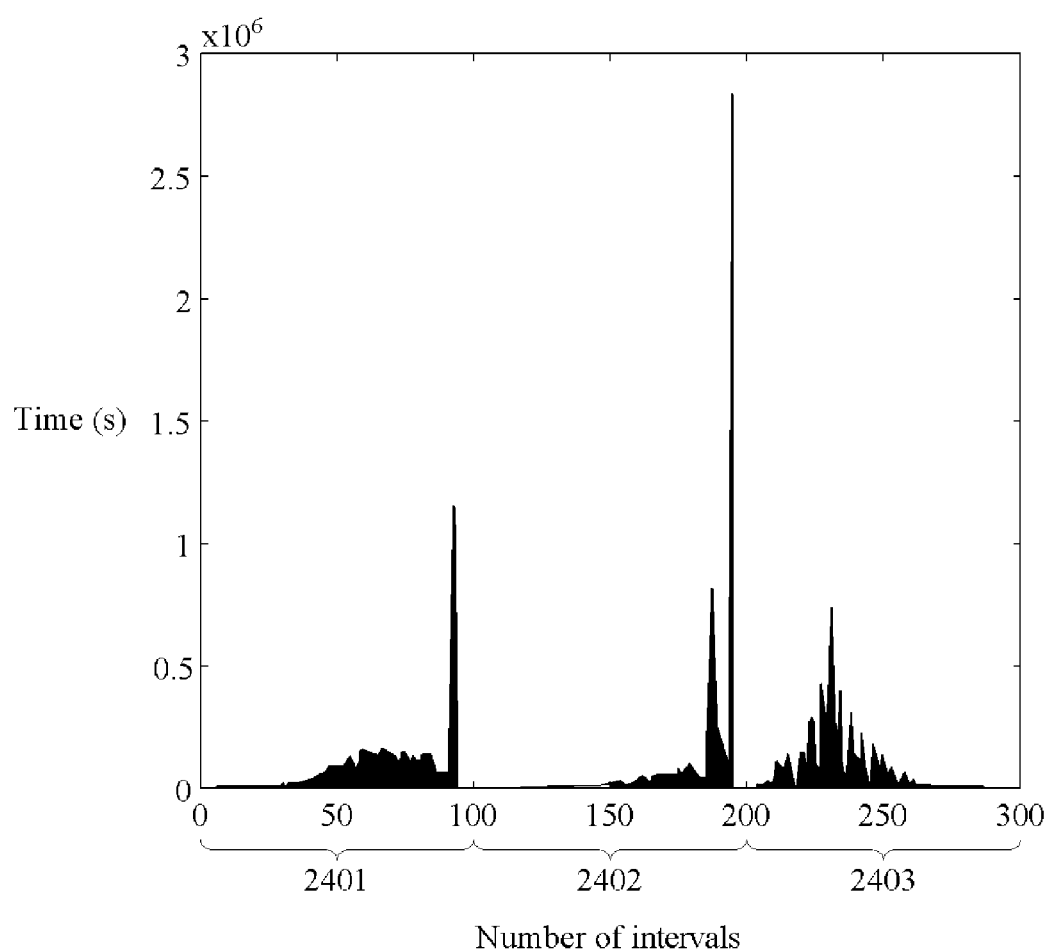
FIG. 24 illustrates an example of an input vector.

FIG. 24 illustrates an example of an input vector.

The input vector may indicate at least one of battery information. The input vector of FIG. 24 may include, as elements, interval information of a voltage signal, interval information of a current signal, and interval information of a temperature signal. Referring to FIG. 24, the interval information of the voltage signal, the interval information of the current signal, and the interval information of the temperature signal are represented by voltage interval information 2401, current interval information 2402, and temperature interval information 2403, respectively.

The input vector is a set of vectors corresponding to interval information accumulated for each of a plurality of intervals in a predetermined range. For example, the input vector is a set of first voltage interval information to n-th voltage interval information, first current interval information to m-th current interval information, and first temperature interval information to l-th temperature interval information. In this example, n, m, and l each denote an integer equal to or greater than "1."

The voltage interval information 2401 is acquired by accumulating amounts of time during which a voltage signal value corresponding to each of the intervals is measured. The current interval information 2402 is acquired by accumulating amounts of time during which a current signal value corresponding to each of the intervals is measured. The temperature interval information 2403 is acquired by accumulating amounts of time during which a temperature signal value corresponding to each of the intervals is measured.

Referring to FIG. 24, the input vector is interval information acquired by partitioning each of the voltage signal, the current signal, and the temperature signal into 100 uniform intervals. The voltage signal may be assumed to a voltage of 2.6 V to 4.3 V, the current signal may be assumed to a current of −10 ampere (A) to 1.6 A, and the temperature signal may be assumed to a temperature of 19° to 28°. Battery information including the voltage signal, the current signal, and the temperature signal of FIG. 24 may be collected from battery data stored in advance. The battery data may be, for example, full charge/discharge data to which an UDDS profile is applied.

Figure 25:
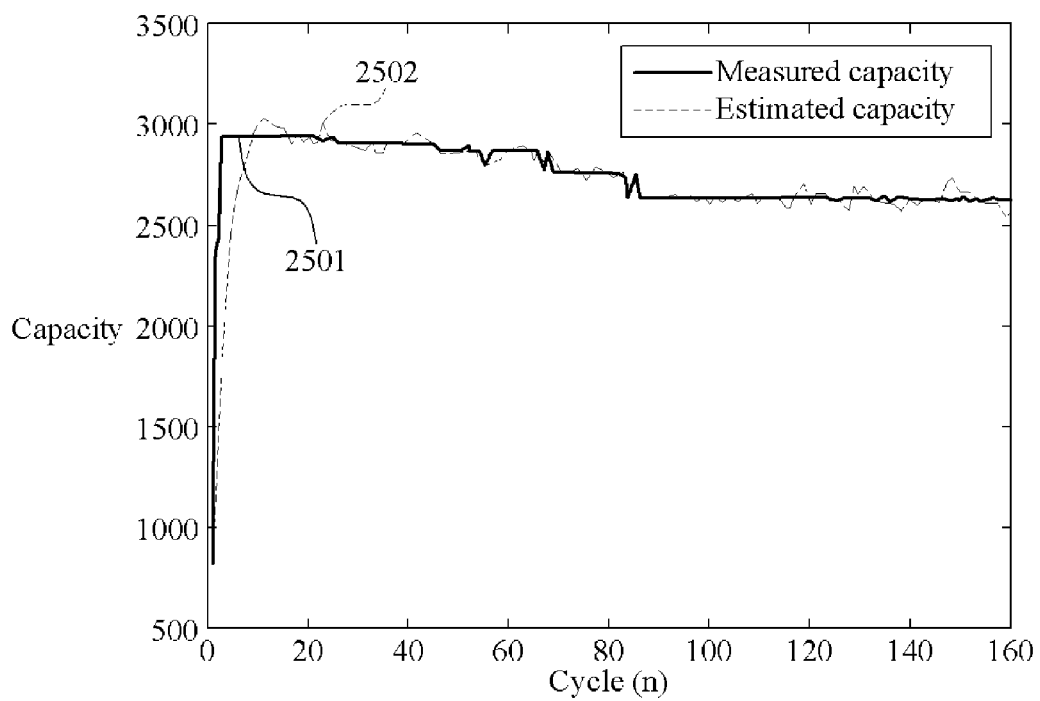
FIG. 25 illustrates an example of a comparison between a measured capacity of a battery and an estimated capacity of the battery.

FIG. 25 illustrates an example of a comparison between a measured capacity 2501 of a battery and an estimated capacity 2502 of the battery.

In one example, using a learner in which battery information is learned for each interval, the estimated capacity 2502 is similar to the measured capacity 2501 that is obtained by actually measuring a capacity of the battery.

Figure 26:
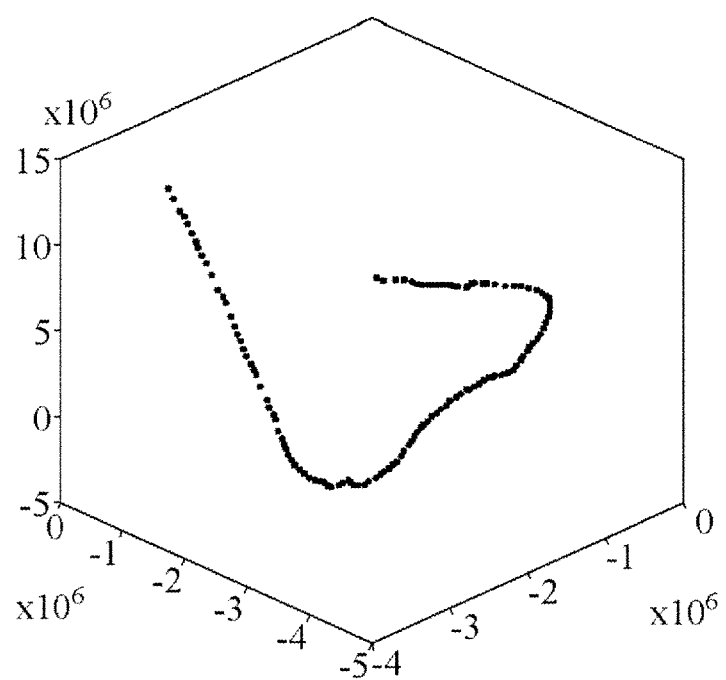
FIG. 26 illustrates an example of a transformed input vector.

FIG. 26 illustrates an example of a transformed input vector.

Referring to FIG. 26, the input vector is transformed so that a dimension of the input vector is reduced through operation 2231 of FIG. 22 and operation 2331 of FIG. 23. The transformed input vector of FIG. 26 has a three-dimensional (3D) shape.

The collector 1510, the measurer 1511, the interval partitioner 1512, the charge/discharge sensor 1513, the accumulator 1520, the interval information storage 1521, the estimator 1530, the learner 1531, and the parameter storage 1532 in FIG. 15; the interval partitioner 1612, the charge/discharge sensor 1613, the accumulator 1620, the interval information storage 1621, the learner 1631, and the parameter storage 1632 in FIG. 16; the interval partitioner 1712, the charge/discharge sensor 1713, the accumulator 1720, the interval information storage 1721, the learner 1731, the parameter storage 1732, and the interface 1740 in FIG. 17; the interval partitioner 1812, the charge/discharge sensor 1813, the accumulator 1820, the interval information storage 1821, the transformation unit 1822, the learner 1831, and the parameter storage 1832 in FIG. 18; and the interval partitioner 1912, the charge/discharge sensor 1913, the accumulator 1920, the interval information storage 1921, the transformation unit 1922, the learner 1931, the parameter storage 1932, and the interface 1940 in FIG. 19 that perform the various operations described with respect to FIGS. 9-26 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Functional programs, codes, and code segments for implementing the examples disclosed herein can be easily constructed by a programmer skilled in the art to which the examples pertain based on the drawings and their corresponding descriptions as provided herein.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

While this disclosure includes specific examples, it will be apparent to one of ordinary skill in the art that various changes in form and details may be made in these examples without departing from the spirit and scope of the claims and their equivalents. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method, performed in a computing apparatus in a battery management system, of estimating battery state information of a battery, the method comprising:
   measuring, using plural sensors for the computing apparatus in the battery management system, respective battery information, associated with the battery, for a plurality of intervals, wherein lengths of the plurality of intervals are variably set dependent on resolutions of the plural sensors;
   generating, using one or more processors of the computing apparatus, interval information by partitioning the measured battery information into the interval information in a predetermined range;
   accumulating, using the one or more processors, the interval information for each of the plurality of intervals;
   generating, using the one or more processors, an input vector corresponding to the accumulated interval information;
   transforming, using the one or more processors, the input vector by reducing a dimension of the input vector; and
   estimating, using the one or more processors, the battery state information based on the transformed input vector and learning information determined in advance for reducing a time required to estimate the battery state information using the transformed input vector and the learning information and/or improving an accuracy to estimate the battery state information using the transformed input vector and the learning information.

2. The method of claim 1, further comprising storing the learning information based on reference information of a battery.

3. The method of claim 2, wherein the storing comprises generating a parameter corresponding to the learning information based on the reference information and sample interval information into which sample battery information is partitioned in the predetermined range.

4. The method of claim 3, wherein the generating of the parameter comprises learning the parameter by inputting the reference information and the sample interval information to a learner.

5. The method of claim 4, wherein the estimating comprises estimating the battery state information by inputting the accumulated interval information to the learner in which the parameter is learned.

6. The method of claim 1, wherein the collecting comprises measuring in real time any one or any combination of a voltage signal, a current signal, and a temperature signal of a battery.

7. The method of claim 1, wherein the collecting comprises determining, based on a current signal of the battery, whether the battery is being charged or discharged.

8. The method of claim 1, wherein the partitioning comprises setting a uniform interval in the predetermined range for each of the interval information.

9. The method of claim 1, wherein the partitioning further comprises setting a first interval in the predetermined range for an interval, among from the plurality of intervals, having a high data generation probability or a second interval in the predetermined range for an interval, among from the plurality of intervals, having a low data generation probability in the battery information, and
   wherein the first interval is determined to be narrower than the second interval such that the first interval and the second interval correspond to non-uniform intervals.

10. A processor-implemented method, performed in a computing apparatus in a battery management system, of estimating battery state information of a battery, the method comprising:
    accumulating, using one or more processors of the computing apparatus, a usage history of the battery for a plurality of intervals, wherein
    the usage history is measured using plural sensors for the computing apparatus, and lengths of the plurality of intervals are variably set dependent on resolutions of the plural sensors;
    generating, using the one or more processors, an input data set corresponding to the accumulated usage history;
    transforming, using the one or more processors, the input data set by reducing a dimension of the input data set; and
    estimating, using the one or more processors, the battery state information based on the transformed input data set and learning information determined in advance for reducing a time required to estimate the battery state information using the transformed input vector and the learning information and/or improving an accuracy to estimate the battery state information using the transformed input vector and the learning information.

11. The method of claim 10, wherein the accumulating comprises:
   partitioning the usage history into interval information in a predetermined range; and
   accumulating the interval information and storing the usage history for each interval of the plurality of intervals.

12. The method of claim 10, wherein the estimating comprises estimating the battery state information by inputting the accumulated usage history to a learner configured to learn the learning information.

13. The method of claim 10, wherein the learning information comprises a parameter generated based on reference information of the battery and sample interval information into which sample battery information is partitioned in a predetermined range.

14. The method of claim 10, wherein the accumulating comprises accumulating a per-interval usage history of any one or any combination of a voltage signal, a current signal, and a temperature signal of the battery.

15. The method of claim 10, wherein the generated input data set corresponding to the accumulated usage history is a generated input vector corresponding to the usage history.

16. The method of claim 10, wherein the accumulating comprises:
   determining, by the one or more processors using the plural sensors and based on a current signal of the battery, whether the battery is being charged or discharged; and
   separately accumulating, by the one or more processors using the plural sensors, a usage history corresponding to charging of the battery and a usage history corresponding to discharging of the battery.

17. An apparatus in a battery management system for estimating battery state information of a battery, the apparatus comprising:
   a collector configured to measure, using plural sensors for the apparatus, respective battery information, associated with the battery, for a plurality of intervals, wherein lengths of the plurality of intervals are variably set dependent on resolutions of the plural sensors;
   an accumulator configured to accumulate interval information, for each of the plurality of intervals, into which the measured battery information is partitioned in a predetermined range;
   a generator configured to generate an input vector corresponding to the accumulated interval information;
   a transformer configured to transform the input vector by reducing a dimension of the input vector; and
   an estimator configured to estimate the battery state information based on the transformed the input vector and learning information determined in advance for reducing a time required to estimate the battery state information using the transformed input vector and the learning information and/or improving an accuracy to estimate the battery state information using the transformed input vector and the learning information.

18. The apparatus of claim 17, wherein the estimator comprises a learner configured to output the battery state information using a parameter corresponding to the learning information in response to receiving the accumulated interval information.

19. The apparatus of claim 17, further comprising an interface configured to transmit the estimated battery state information to an external device.

* * * * *